(12) United States Patent
Finkelman et al.

(10) Patent No.: US 11,459,654 B2
(45) Date of Patent: Oct. 4, 2022

(54) LIQUID PRECURSOR INJECTION FOR THIN FILM DEPOSITION

(71) Applicant: Eugenus, Inc., San Jose, CA (US)

(72) Inventors: Alex Finkelman, San Jose, CA (US); Niloy Mukherjee, San Ramon, CA (US); Miguel Saldana, Santa Cruz, CA (US)

(73) Assignee: Eugenus, Inc., San Jose, CA (US)

( * ) Notice: Subject to any disclaimer, the term of this patent is extended or adjusted under 35 U.S.C. 154(b) by 0 days.

(21) Appl. No.: 16/952,493

(22) Filed: Nov. 19, 2020

(65) Prior Publication Data

US 2022/0154332 A1 May 19, 2022

(51) Int. Cl.
*C23C 16/448* (2006.01)
*C23C 16/455* (2006.01)
(Continued)

(52) U.S. Cl.
CPC .... *C23C 16/4486* (2013.01); *C23C 16/45512* (2013.01); *C23C 16/45525* (2013.01);
(Continued)

(58) Field of Classification Search
None
See application file for complete search history.

(56) References Cited

U.S. PATENT DOCUMENTS

| | | |
|---|---|---|
| 9,387,447 B2 * | 7/2016 | Guillon ...................... B01F 5/04 |
| 2002/0043215 A1 | 4/2002 | Yoshioka et al. |
| 2004/0013800 A1 | 1/2004 | Strauch et al. |

(Continued)

FOREIGN PATENT DOCUMENTS

| | | | |
|---|---|---|---|
| WO | WO 99/16929 | 4/1999 | |
| WO | WO-0136707 A1 * | 5/2001 | ......... C23C 16/4486 |
| WO | WO 2012/175334 A2 | 12/2012 | |

OTHER PUBLICATIONS

Astié et al., "Provisional Chapter—Direct Liquid Injection Chemical Vapor Deposition", © 2018 IntechOpen, 25 pages.
(Continued)

*Primary Examiner* — Jose I Hernandez-Kenney
(74) *Attorney, Agent, or Firm* — Knobbe, Martens, Olson & Bear, LLP

(57) ABSTRACT

The disclosed technology relates generally to semiconductor processing and more particularly to liquid precursor injection apparatus and methods for depositing thin films. A method of injecting a liquid precursor into a thin film deposition chamber comprises delivering a vaporized liquid precursor into the thin film deposition chamber by atomizing the liquid precursor into atomized precursor droplets using a liquid injection unit and vaporizing the atomized precursor droplets into the vaporized liquid precursor in a vaporization chamber. The liquid injector unit and the liquid precursor are such that operating the liquid precursor delivery unit under a lower stability condition, including a first liquid precursor temperature at the liquid injection unit, a first liquid precursor pressure upstream of the liquid precursor injection unit and a first gas pressure downstream of the liquid precursor injection unit, causes a mass flow rate of the liquid precursor to vary by more than 10% relative to an average mass flow rate of the liquid precursor during a first time duration. Delivering the vaporized liquid precursor into the thin film deposition chamber comprises operating the liquid precursor delivery unit under a higher stability condition. The higher stability includes one or more of: a second liquid precursor temperature at the liquid injection unit that is lower than the first liquid temperature; a second liquid pressure upstream of the injection unit that is higher than the first liquid pressure; and a second gas pressure downstream of the liquid injection unit that is higher than the first Gas pressure. The higher (Continued)

stability is such that that the mass flow rate of the liquid precursor varies by less than 10% relative to an average mass flow rate during a second time duration having the same time duration as the first time duration.

20 Claims, 7 Drawing Sheets

(51) Int. Cl.
    *C23C 16/52*     (2006.01)
    *C23C 16/54*     (2006.01)
    *H01J 37/32*     (2006.01)

(52) U.S. Cl.
    CPC .............. *C23C 16/52* (2013.01); *C23C 16/54* (2013.01); *C23C 16/45557* (2013.01); *H01J 37/32449* (2013.01)

(56) References Cited

U.S. PATENT DOCUMENTS

| | | | |
|---|---|---|---|
| 2004/0035202 A1 | 2/2004 | Strauch et al. | |
| 2010/0012027 A1* | 1/2010 | Poignant | C23C 16/45557 118/692 |
| 2017/0056912 A1 | 3/2017 | Choi et al. | |
| 2018/0148836 A1 | 5/2018 | Long et al. | |

OTHER PUBLICATIONS

Baumann et al., "Innovative Deposition Technology for Advanced Materials", ECS Transactions, vol. 28, No. 1, pp. 137-144 (2010).
Boer, IR. H.J., "Precision Mass Flow Metering for CVD Applications.", Research Department of Bronkhorst High-Tech B.V., 8 pages (Sep. 1999)(downloaded on Oct. 17, 2020).
Gordon, R.G., "Overview of ALD Precursors and Reaction Mechanisms", dated 2011, Department of Chemistry and Chemical Biology, Harvard University, Cambridge, MA 02138, U.S.A., 67 pages.
Nordson EFD, PICO™ Valve Operating Manual, http://dsglobal.biz/p/Nordson-EFD-PICO-Valve-Manual.pdf, © 2012 Nordson Corporation (downloaded on Dec. 18, 2019).
Scardina et al., "Chapter 1—The Fundamentals of Bubble Formation in Water Treatment", pp. 1-22 (2000) (downloaded on Oct. 17, 2020).
Vezin et al., "Atomic Vapor Deposition (AVD®) for High-k Dielectric and Ferroelectric films", Conference Paper, Jun. 2007, DOI: 10.1109/ISAF.2007.4393159, IEEE Xplore, 4 pages.
Invitation to Pay Additional Fees and, Where Applicable, Protest Fee dated Jan. 13, 2022 in counterpart International Application No. PCT/US2021/072113, in 2 pages.
International Search Report and Written Opinion dated Mar. 3, 2022 in corresponding PCT Application No. PCT/US2021/072113 in 22 pages.

* cited by examiner

LIQUID PRECURSOR INJECTION FOR THIN FILM DEPOSITION

BACKGROUND

Field of the Invention

The disclosed technology relates generally to semiconductor processing and more particularly to liquid precursor injection apparatus and methods for depositing thin films.

Description of the Related Art

As semiconductor devices continue to scale in lateral dimensions, there is a corresponding scaling of vertical dimensions of the semiconductor devices, including thickness scaling of the functional thin films such as electrodes and dielectrics. Semiconductor fabrication involves various thin films that are deposited throughout the process flow. Various thin films can be deposited using various techniques, including wet and dry deposition methods. Wet deposition methods include, e.g., aerosol/spray deposition, sol-gel method and spin-coating. Dry deposition methods include physical vapor-based techniques, e.g., physical vapor deposition (PVD) and evaporation. Dry deposition methods additionally include precursor and/or chemical reaction-based techniques, e.g., chemical vapor deposition (CVD) and atomic layer deposition (ALD).

SUMMARY

In a first aspect, a method of injecting a liquid precursor into a thin film deposition chamber comprises delivering a vaporized liquid precursor into the thin film deposition chamber by atomizing the liquid precursor into atomized precursor droplets using a liquid injection unit and vaporizing the atomized precursor droplets into the vaporized liquid precursor in a vaporization chamber. The liquid injector unit and the liquid precursor are such that operating the liquid precursor delivery unit under a lower stability condition, including a first liquid precursor temperature at the liquid injection unit, a first liquid precursor pressure upstream of the liquid precursor injection unit and a first gas pressure downstream of the liquid precursor injection unit, causes a mass flow rate of the liquid precursor to vary by more than 10% relative to an average mass flow rate of the liquid precursor during a first time duration. Delivering the vaporized liquid precursor into the thin film deposition chamber comprises operating the liquid precursor delivery unit under a higher stability condition. The higher stability includes one or more of: a second liquid precursor temperature at the liquid injection unit that is lower than the first liquid precursor temperature; a second liquid pressure upstream of the injection unit that is higher than the first liquid pressure; and a second gas pressure downstream of the liquid injection unit that is higher than the first Gas pressure. The higher stability is such that that the mass flow rate of the liquid precursor varies by less than 10% relative to an average mass flow rate during a second time duration having the same time duration as the first time duration.

In a second aspect, a method of delivering a liquid precursor into a thin film deposition chamber comprises providing a liquid precursor delivery unit configured to deliver a vaporized liquid precursor into the thin film deposition chamber by atomizing the liquid precursor into atomized precursor droplets using a liquid injection unit and vaporizing the atomized precursor droplets into the vaporized liquid precursor in a vaporization chamber. The method additionally includes delivering a vaporized liquid precursor into the thin film deposition chamber under a lower stability condition, which includes a first liquid precursor temperature at the liquid injection unit, a first liquid precursor pressure upstream of the liquid precursor injection unit and a first gas pressure downstream of the liquid precursor injection unit. The method additionally includes detecting a variation in mass flow rate of the liquid precursor that is greater than 10% relative to an average mass flow rate of the liquid precursor during a first time duration. The method further comprises delivering the vaporized liquid precursor into the thin film deposition chamber under a higher stability condition. The higher stability condition includes one or more of: a second liquid precursor temperature at the liquid injection unit that is lower than the first liquid precursor temperature; a second liquid precursor pressure upstream of the injection unit that is higher than the first liquid precursor pressure; and a second gas pressure downstream of the liquid injection unit that is higher than the first gas pressure. The higher stability condition is such that the mass flow rate of the liquid precursor varies by less than 10% relative to an average mass flow rate during a second time duration having the same time duration as the first time duration.

In a third aspect, an apparatus for delivering a liquid precursor into a thin film deposition chamber comprises a liquid precursor delivery system configured to deliver a vaporized liquid precursor into the thin film deposition chamber. The liquid precursor delivery system comprises a liquid injection unit configured to atomize the liquid precursor into atomized precursor droplets, a mixing area configured to receive the atomized precursor droplets from the liquid injection unit and to form a mixture including the atomized precursor droplets and a carrier gas, and a vaporization chamber configured to receive the mixture and to vaporize the atomized precursor droplets in the mixture to form the vaporized liquid precursor. The apparatus additionally comprises a liquid precursor delivery stability control system comprising one or more of: an injection unit temperature control system configured to sense and control a liquid precursor temperature at the liquid injection unit prior to being introduced into the mixing area; a carrier gas temperature control system configured to sense and control a carrier gas temperature prior to being introduced into the mixing area; a liquid push pressure control system configured to sense and control a liquid precursor pressure upstream of the liquid precursor injection unit; and a downstream gas pressure control system configured to sense and control a gas pressure downstream of the liquid precursor injection unit.

DETAILED DESCRIPTION

Figure 1A:
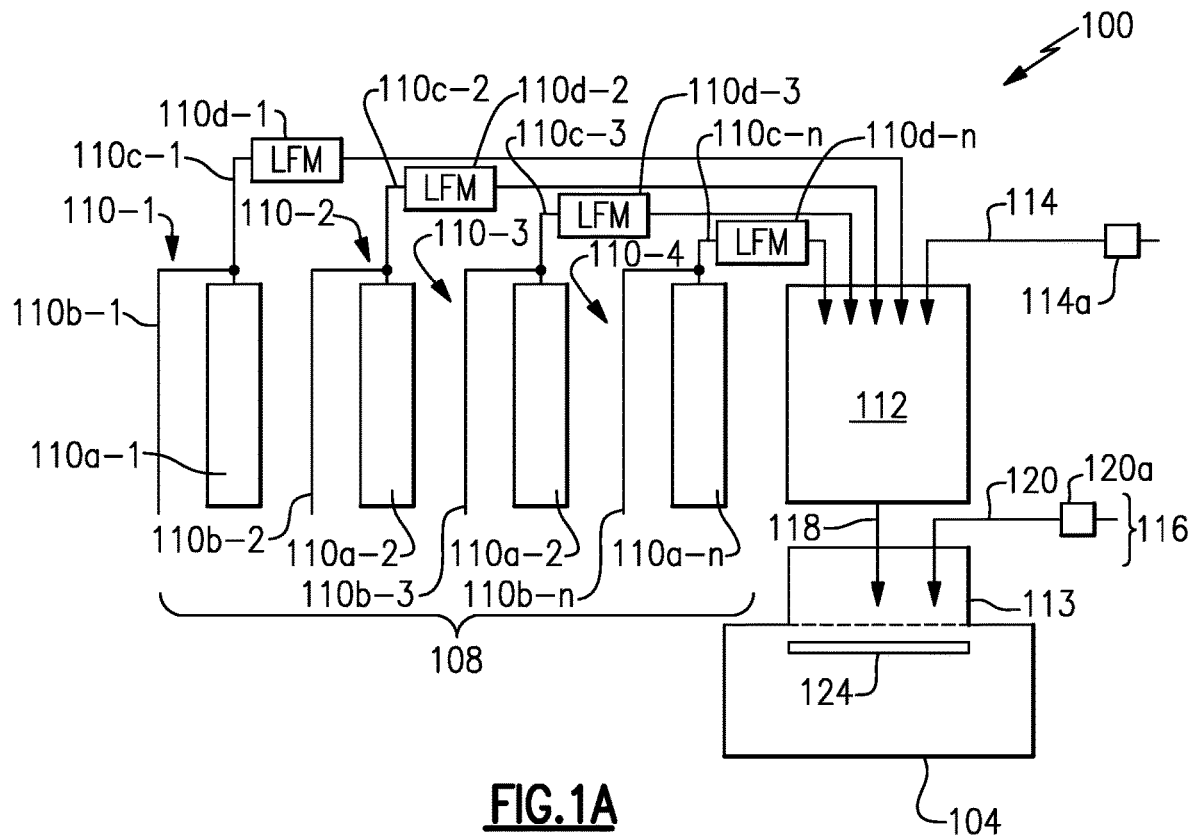
FIG. 1A illustrates a thin film deposition system configured to deliver a vaporized liquid precursor into a thin film deposition chamber, according to embodiments.

Cyclic deposition processes such as atomic layer deposition (ALD) processes can provide a relatively conformal conductive and insulating thin films on relatively high aspect-ratio (e.g., 2:1) structures with high uniformity. While generally less conformal and uniform compared to ALD, thin films deposited using continuous deposition processes such as chemical vapor deposition (CVD) can provide higher productivity and lower cost. ALD and CVD can be used to deposit a variety of different films including elemental metals, semiconductors (e.g., Si, III-V, etc.), dielectrics (e.g., $SiO_2$, AlN, $HfO_2$, $ZrO_2$, etc.), rare-earth oxides, conducting oxides and oxides (e.g., TiN, $IrO_2$ etc.), ferroelectrics (e.g., $PbTiO_3$, $LaNiO_3$, etc.), superconductors (e.g., $YBa_2Cu_3O_{7-x}$), chalcogenides (e.g., GeSbTe), to name a few.

In precursor or chemical reaction-based thin film deposition techniques such as CVD and ALD processes, precursors are delivered into a reactor and transported therein to a substrate, which may be heated, to deposit the thin films. While gaseous precursors having high vapor pressures (e.g., >0.1 Torr) may be relatively easy to control, not all precursors are in gaseous form at atmospheric pressure and ambient temperature. Many precursors are available in liquid form. Compared to delivery of gaseous precursors, delivery of liquid precursors into a reactor chamber with precision is relatively more difficult to control, which in turn makes it more difficult to control the composition, nanostructure and consistency of the resulting thin films using liquid precursors, compared to gas precursors. Thus, there is a need for improved delivery of liquid precursors into a reactor chamber for improved control of the resulting thin film deposition characteristics such as the growth rate, within-substrate uniformity, substrate-to-substrate uniformity, surface morphology, and film density, to name a few.

In some conventional precursor or chemical reaction-based thin film deposition techniques based on liquid precursors, a bubbler technology may be used. In a bubbler technique, a liquid precursor is stored inside a bubbler, typically a stainless steel canister, and an inert carrier gas (e.g., Ar, He or $N_2$) is introduced inside the liquid to bubble. The precursor vapor saturates the atmosphere in the bubbler and thus generated vapor is introduced onto the substrate surface. The delivery of reactants in these technologies depends on parameters including the temperature of the bubbler, the carrier gas flow rate, and the pressure over the surface of the liquid. While bubbler-based techniques may work satisfactorily with some liquid precursors, they may not be suitable for precursors having relatively low vapor pressure. This is because, while heating the bubbler may be a practical way to increase the vapor pressure inside the canister, the maximum temperature to which the bubbler may be heated to may be limited to the decomposition temperature of the precursor. However, many liquid precursors have a relatively low decomposition temperature. Thus, the bubbler-based techniques may not be practical for precursors having a relatively narrow temperature window, e.g., less than about 150° C., 100° C. or 50° C. between the temperature at which the vapor pressure is high enough for practical (e.g., >0.1 Torr) use and the temperature at which the precursor decomposes. As a result, the bubbler-based techniques may be limited to techniques that employ precursors that are stable at relatively high temperature.

To overcome the limitations of bubbler-based liquid precursor delivery methods, systems and methods described herein employ a direct liquid injection technique. As used herein, the term direct liquid injection (DLI) refers to techniques that use liquid precursor delivery units, e.g., injectors, to feed the deposition zone in reactants. Unlike other techniques such as bubbler technologies, in DLI-based techniques, the liquid precursor remains in liquid form up to the point of injection into a low pressure deposition chamber under vacuum. The DLI-based techniques enables precision regulation of the liquid mass flow rate, even for precursors that have a relatively narrow temperature window between the temperature at which the vapor pressure is high enough for practical use (e.g., >0.1 Torr) and the temperature at which the precursor decomposes. According to some embodiments disclosed herein, the temperature window of the precursors used by the methods and systems of liquid precursor delivery may be less than 150° C., 100° C., 50° C., 25° C., or a temperature window between any of these values.

In some DLI-based techniques, the liquid precursor goes through an evaporation chamber where it is vaporized, and in other cases, the precursors reach the surface of a heated substrate in a liquid state, e.g., in the form of atomized liquid precursor droplets, which are then vaporized prior to decomposition. If the precursor is still in liquid phase when it reaches the substrate, the deposition method may be referred to as spray or aerosol pyrolysis, depending on the generation method of the liquid droplets. Some spray/aerosol pyrolysis processes may be called atmospheric pressure CVD, as usually the evaporation takes place in proximity of the substrate heated to high temperatures. The advantages of DLI-based techniques include relatively low temperature of the liquid precursor, e.g., room temperature, which makes it possible to use precursors with low thermal stability and low vapor pressure.

The inventors have recognized that some conventional liquid delivery systems and methods can suffer from mass flow rate instability of the liquid precursor. Without being bound to any theory, the inventors have discovered that one of the causes of the mass flow rate instability may be associated with, among other things, unintended or excessive vaporization of the liquid precursor at or near a conventional valve or injector, upstream of the point of injection, prior to being injected at the point of injection into a low pressure area, e.g., a vaporization chamber. When delivered by a conventional valve or an injector, the liquid precursor is intended to remain in liquid phase up to the point of injection. However, the inventors have discovered that unintended vaporization of the liquid precursor can occur in substantial amounts upstream of the point of injection. The unintended vaporization upstream of the point of injection may occur in part because the liquid precursor may be heated close to a vaporization temperature at the point of injection, and/or because the gas pressure downstream of the valve or the injector may be at a pressure that is substantially lower that the vaporization pressure during deposition. As a result, unintended vaporization of the liquid precursor can occur in substantial amounts upstream of the point of injection. The vaporization of the liquid precursor upstream of the point of injection may lead to pockets of gas or bubbles therein, which can in turn lead to instabilities in the mass flow rate of the liquid precursor for depositing thin films in the thin film deposition chamber. To address these and other needs, systems and methods disclosed herein enable the delivery of the liquid precursor into a thin film deposition chamber with enhanced stability and repeatability of the mass flow rate of the liquid precursor.

Thin Film Deposition System Configured for Liquid Precursor Injection

FIG. 1A illustrates a thin film deposition system configured to deliver a vaporized liquid precursor into a thin film deposition chamber, according to embodiments. The thin film deposition system 100 includes a liquid precursor delivery unit 112 configured to receive one or more liquid precursors from a liquid precursor panel 108. The liquid precursor delivery unit 112 is further configured to receive a carrier gas, e.g., hydrogen or an inert gas such as Ar or $N_2$, the flow of which is controlled by a mass flow controller 114a, through a carrier gas line 114. The liquid precursor delivery unit 112 is configured to output one or more vaporized liquid precursors into a thin film deposition chamber 104. The thin film deposition chamber 104 is configured to receive the vaporized liquid precursors through one or more liquid precursor inlet lines 118, and further configured to receive one or more gas precursors, e.g., oxidants such as $O_2$ or $NH_3$, the flow of which is controlled by a mass flow controller 120a, through one or more gas precursor inlet lines 120 from a gas panel 116.

The liquid panel 108 includes one or more liquid precursor source units 110-1, 110-2, . . . , 110-n, which in turn comprise respective ones of liquid tanks 110a-1, 110a-2, . . . , 110a-n configured to hold respective liquid precursors. The liquid tanks 110a-1, 110a-2, . . . , 110a-n are connected to respective ones of push gas lines 110b-1, 110b-2, . . . , 110b-n, and to respective ones of liquid delivery lines 110c-1, 110c-2, . . . , 110c-n. Respective ones of liquid flow meters (LFMs) 110d-1, 110d-2, . . . , 110d-n are disposed in the flow paths of the liquid delivery lines 110c-1, 110c-2, . . . , 110c-n between the liquid tanks 110a-1, 110a-2, . . . , 110a-n and the liquid precursor delivery unit 112.

In the illustrated embodiment, multiple liquid precursors are depicted as being introduced into a precursor delivery unit 112, which serves as a common liquid precursor delivery unit for the multiple liquid precursors. However, configurations are not so limited and in other configurations (not shown), a plurality of liquid precursor delivery units may be present, where each precursor injection unit is dedicated to a respective liquid precursor. Furthermore, a single carrier gas line 114 is depicted as being connected to the liquid precursor delivery unit 112. However, configurations are not so limited, and there can be a plurality carrier gas lines (now shown), where each carrier gas line is connected to a dedicated liquid injection unit, such that each liquid injection unit receives a dedicated liquid precursor and a dedicated carrier gas (e.g., FIG. 2).

Each of the liquid precursor source units 110-1, 110-2, . . . , 110-n may be qualitatively operated in a similar manner. Referring to the liquid precursor source unit 110-1 by way of example, a push gas, e.g., hydrogen or an inert gas such as helium, argon or nitrogen, flows into the liquid tank 110a-1 out of the push gas line 110b-1 through a gas mass flow controller (not shown). The push gas pushes the liquid precursor out of the liquid tank 110a-1, and the liquid delivery line 110c-1 delivers the liquid precursor pushed out from the liquid tank 110a-1 to the liquid precursor delivery unit 112.

Figure 1B:
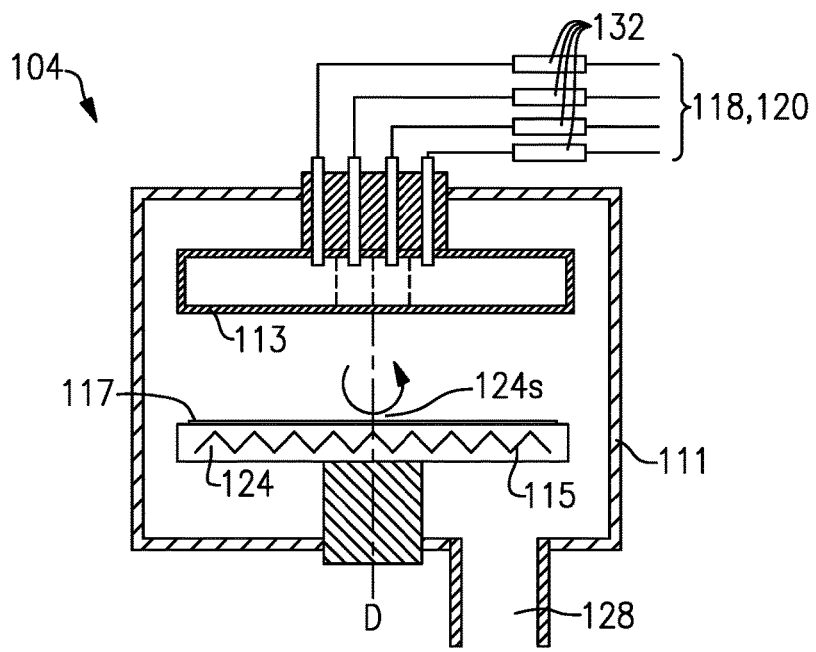
FIG. 1B illustrates the thin film deposition chamber of the thin film deposition system illustrated in FIG. 1A, according to embodiments.

FIG. 1B illustrates a thin film deposition chamber of a thin film deposition system, e.g., the thin film deposition system 100 described above with respect to FIG. 1A, according to embodiments. The thin film deposition chamber 104 includes a chamber housing 111 configured to seal the chamber airtight under a vacuum.

The lower portion of the thin film deposition chamber 104 includes a susceptor 124 having a top surface 124S configured for a substrate 117 to be disposed thereon. The susceptor 124 can be heated to a process temperature by a heater 115. In some configurations, the susceptor 124 may be rotated about an axis of rotation D to improve film uniformity. The rotation can take place relative to a central axis. A vacuum pump (not shown) connected to the thin film deposition chamber 104 via an outlet 128 is configured to evacuate gases in the thin film deposition chamber 104. The upper portion of the thin film deposition chamber 104 includes a gas distribution plate or a showerhead 113 having a plurality of openings to eject a mixture of gases therethrough over the substrate 117.

One or more liquid precursor inlet lines 118 configured to deliver vaporized liquid precursors from the liquid precursor delivery unit 112 and one or more gas precursor inlet lines 120 configured to deliver respective gas precursors, e.g., oxidants from the gas panel 116, are connected to the showerhead 113. One or more mass flow meters 132 may be disposed in the paths of the liquid precursor inlet lines 118 and gas precursor inlet lines 120 to measure the mass flow rate of the vaporized liquid precursor and the gas precursors. The variation in a mass flow rate of the vaporized liquid precursor(s) may be sensed by a liquid precursor delivery stability control system 500 (FIG. 5), to activate a method of delivering the liquid precursor at a higher stability condition, according to various embodiments disclosed herein. For example, when the detected mass flow rate of the vaporized liquid precursor(s) varies by more than a manufacturing tolerance, e.g., 10% relative to an average mass flow rate of the liquid precursor during a first time duration, the liquid precursor delivery stability control system 500 may trigger a method 400 (FIG. 4) according to embodiments.

Liquid Precursor Delivery System

Figure 2:
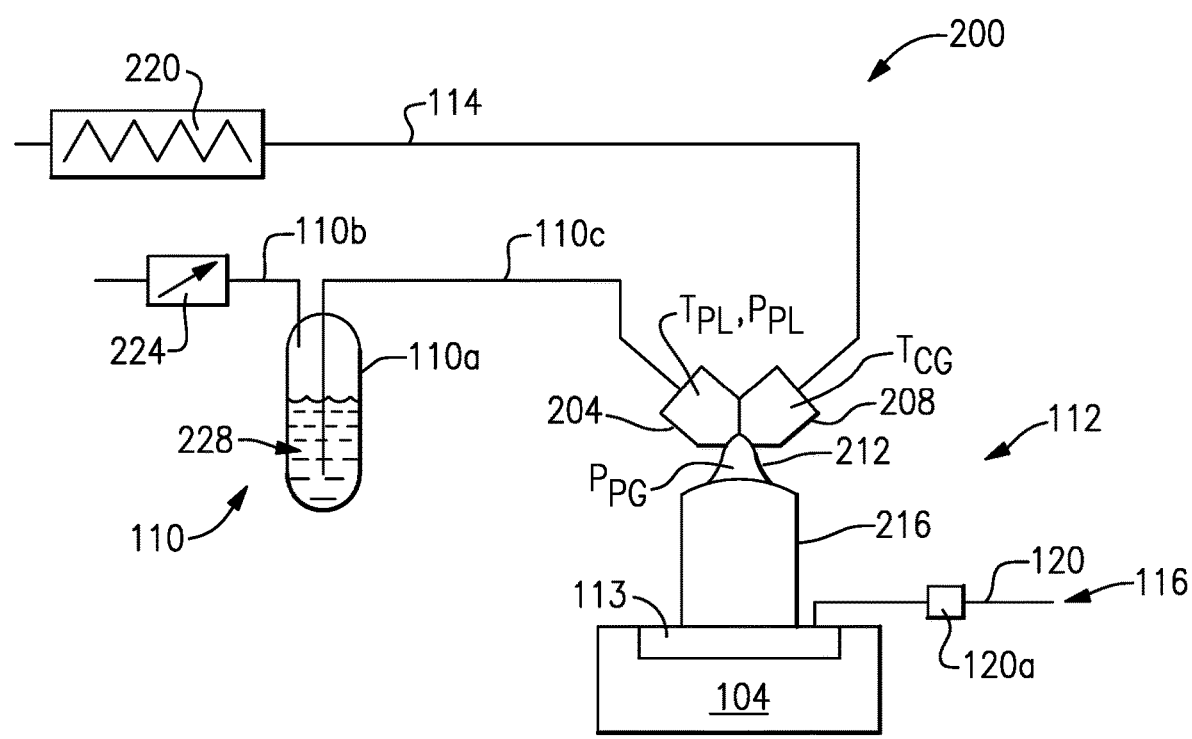
FIG. 2 illustrates a liquid precursor delivery unit for delivering a vaporized liquid precursor into a thin film deposition chamber, according to embodiments.

FIG. 2 illustrates a liquid precursor injection system for delivering a vaporized liquid precursor into a thin film deposition chamber, e.g., the thin film deposition chamber described above with respect to FIG. 1B, according to embodiments. The liquid precursor injection system 200 includes a liquid precursor delivery unit 112. The liquid precursor delivery unit 112 includes a liquid injection unit 204 configured to receive a liquid precursor in liquid phase from a liquid precursor source unit 110. The liquid precursor source unit 110 includes a liquid tank 110a having stored therein a liquid precursor 228. A push gas line 110b is connected to the liquid tank 110a through a pressure regulator 224. The liquid delivery line 110c is connected to the liquid injection unit 204 configured to atomize the liquid precursor 228. As described herein, atomization refers to a process in which the liquid precursor is formed into a spray of liquid precursor droplets. Atomized liquid droplets can have, e.g., an average diameter of about 1 μm-100 μm. The droplets have a ratio of high surface area to volume, and are optimized for rapid evaporation into a vaporized liquid precursor.

In operation, to deliver the liquid precursor 228 out of the liquid tank 110a, a push gas, e.g., hydrogen or an inert gas such as helium, argon or nitrogen is supplied through the push gas line 110b to the liquid tank 110a, in order to displace the liquid precursor 228 from the liquid tank 110a. The gas stream flowing through the push gas line 110b can be regulated by the pressure regulator 224. Thus displaced liquid precursor is delivered to the liquid injection unit 204 through the liquid delivery line 110c.

The liquid precursor delivery unit 112 additionally includes a carrier gas valve 208 configured to receive a carrier gas, which may be hydrogen or an inert gas such as helium, argon or nitrogen, through a carrier gas line 114. A carrier gas heater 220 may be disposed in the path of the carrier gas line 114 to regulate the temperature of the carrier gas delivered to the carrier gas valve 208. The liquid precursor delivery unit 112 additionally includes a mixing area 212 downstream of the liquid injection unit 204 and the carrier gas valve 208 and configured to mix the atomized liquid precursor droplets and the carrier gas to form an atomized liquid precursor mixture. The liquid injection unit 204 and the carrier gas valve 208 are configured to inject the atomized precursor droplets and the carrier gas, respectively, into the mixing area 212. In some configurations, the trajectory of the atomized precursor droplets ejected from the liquid injection unit 204 and the trajectory of the carrier gas ejected from the carrier gas valve 208 may cross at a mixing point within the mixing area 212, such that the atomized liquid precursor mixture is efficiently formed by the mixing of the atomized precursor droplets and the carrier gas, prior to being vaporized.

The atomized liquid precursor mixture formed from the atomized precursor droplets and the carrier gas formed in the mixing area 212 is subsequently introduced into a vaporization chamber 216. The vaporization chamber 216 is configured to vaporize the atomized precursor droplets in the atomized liquid precursor mixture to form a vaporized liquid precursor mixture including the vaporized liquid precursor and the carrier gas. The vaporization chamber 216 can have a volume of approximately one to three liters. The vaporization chamber 216 comprises vaporization means, e.g. a heater. For example, the vaporization of the atomized precursor droplets may be achieved in part by heated the walls of the vaporization chamber 216. The walls of the vaporization chamber 216 may be heated, e.g., to a temperature such that the atomized precursor droplets are heated to a temperature between the vaporization temperature and the decomposition temperature of the liquid precursor at atmospheric pressure. For example, for a liquid precursor having a vaporization temperature of 200° C. and a decomposition temperature of 250° C. at atmospheric pressure, the vaporization chamber 216 may be heated to a temperature between 200° C. and 250° C. The vaporization chamber 216 is configured to deliver the thus formed vaporized liquid precursor mixture into the thin film deposition chamber 104 through liquid precursor inlet 118 and further through a shower head 113, as described above with respect to FIGS. 1A and 1B. One or more gas precursors, e.g., oxidants from the gas panel 116, are delivered through gas precursor inlets 120 also connected to the shower head 113, as described above with respect to FIGS. 1A and 1B.

Still referring to FIG. 2, while connected to the thin film deposition chamber 104 that may be under vacuum or a thin film deposition chamber pressure, the mixing area 212 and the vaporization chamber 216 may be configured to be at a local pressure that is higher than the deposition chamber pressure. The higher local pressure may be achieved by designing the shapes of internal volumes of the mixing area 212 and/or the vaporization chamber 216 to limit their conductance. For example, one or both of the mixing area 212 and the vaporization chamber 216 may include an elongated section that is elongated in a vertical direction perpendicular to the plane of the showerhead 113, such that a pressure gradient exists in the vertical direction. For example, one or both of the mixing area 212 and/or the vaporization chamber 216 may have an aspect ratio between a length in the vertical direction and a width or diameter in a horizontal direction that is greater than 2:1, 4:1, 6:1, 8:1, 10:1 or a value in a range defined by any of these values. Alternatively, the mixing area 212 and/or the vaporization chamber 216 may be partially hindered for evacuation, e.g., by a conductance-limiting orifice. Alternatively, one or both of the mixing area 212 the vaporization chamber 216 may include a continuously adjustable conductance-controlling means at lower portions thereof, e.g., a pressure regulator or a butterfly valve and the like, such that the local pressures therein are higher than that of the deposition chamber pressure. For example, the conductance-controlling means can be disposed between the mixing area 212 and the vaporization chamber 216, and/or between the vaporization chamber 216 and the thin film deposition chamber 104, e.g., upstream of the showerhead 113.

In the illustrated embodiment, the mixing area 212 and the vaporization chamber 216 are depicted as separate chambers. However, configurations are not so limited, and in other configurations, the mixing area 212 may form a portion of the vaporization chamber 216 while having different shape and size of the internal volume, e.g., an elongated volume as described above. In yet some other configurations, the mixing area 212 may be omitted, and the atomized liquid precursor and the carrier gas may be directly introduced into the vaporization chamber 216.

Figure 3A:
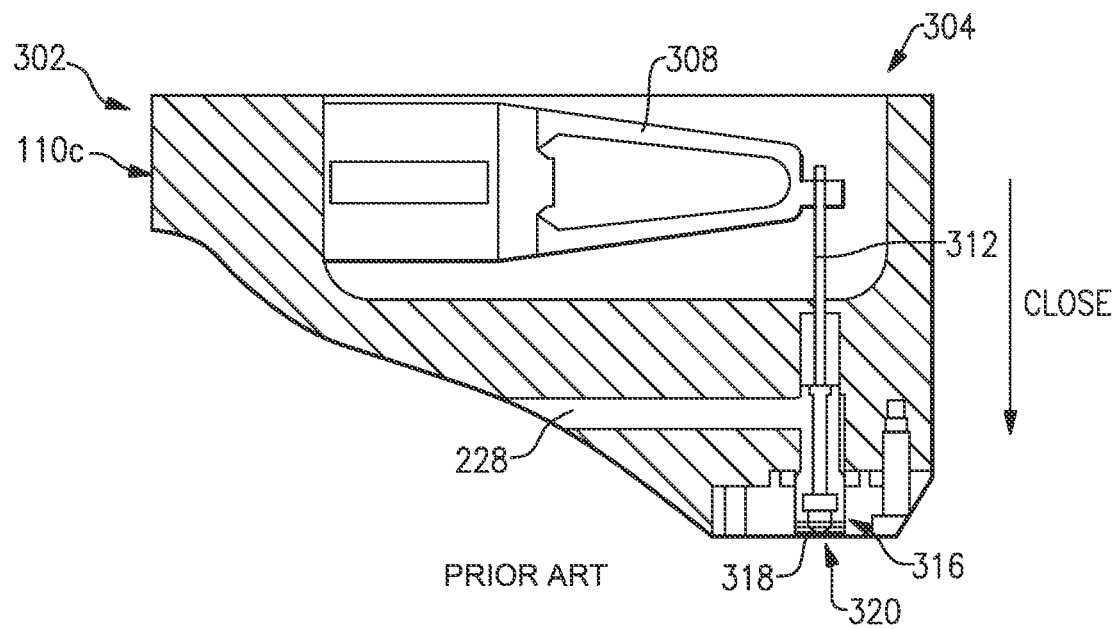
FIGS. 3A and 3B illustrate an example liquid precursor injection unit configured to atomize the liquid precursor into atomized precursor droplets, according to embodiments.
Figure 3B:
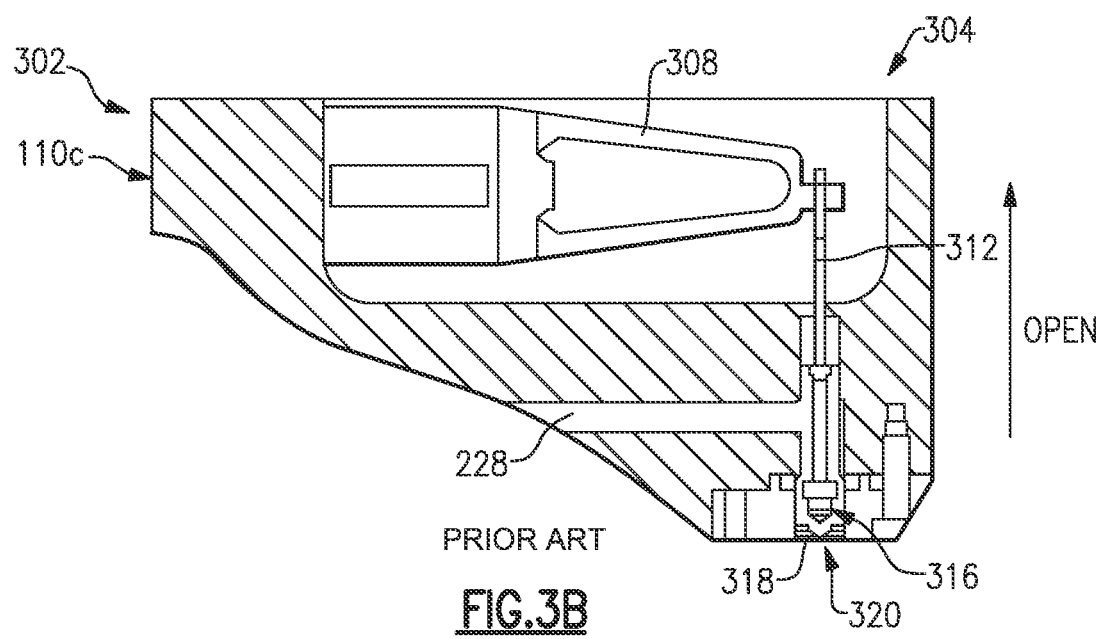

Still referring to FIG. 2, the liquid injection unit 204 can include a suitable means configured to atomize the liquid precursor into atomized precursor droplets or aerosol. In one implementation, the liquid injection unit 204 can include a metering valve. FIGS. 3A and 3B illustrate an example liquid precursor injection unit 204 comprising a metering valve 304 configured to atomize the liquid precursor into atomized precursor droplets, according to embodiments. The depicted example of the metering valve 304 is similar to a PICO™ valve manufactured by Nordson EFD LLC, the specification and design of which is incorporated herein by reference in its entirety. FIG. 3A depicts the metering valve 304 in a closed state and FIG. 3B depicts the metering valve 304 in an open state. The metering valve 304 includes an inlet 302 connected to the liquid delivery line 110c for receiving the liquid precursor 228 from the liquid precursor source unit 110 (FIG. 2), and an outlet 320 connected to the mixing area 212 (FIG. 2). The metering valve 304 includes a lever 308 configured to be driven by piezoelectric actuators to move up and down as indicated by the arrows. The lever 308 has a distal end at which a vertical rod 312 is movably connected thereto. The movement of the lever 308 causes a corresponding vertical movement of the rod 312, as indicated by the arrows. At a bottom end of the rod 312, a hemispherical sealing ball 316 formed of a wear-resistant ceramic is disposed. A ceramic valve seat 318, also referred to as a nozzle plate, is disposed below the sealing ball 316. The ceramic valve seat 318 has an opening that is smaller than a diameter of the sealing ball 316. The opening can have a diameter of, e.g., 50 m to 500 m. For the illustrated example of the metering valve 304, the opening of the valve seat 318 may represent a point of injection. As described herein, the point of injection defines a region within a liquid injection unit 204 at which the liquid precursor 228 is atomized into atomized precursor droplets. The point of injection also defines a point which divides an upstream portion of the metering valve 304 in which the liquid precursor is in liquid state, and a downstream portion of the metering valve 304 which is exposed to a low pressure region, e.g., the mixing area 212.

In operation, as depicted in FIG. 3A, when the sealing ball 316 is seated on the valve seat 318, the opening or the point of injection is closed by the sealing ball 316, thereby preventing the injection of the liquid precursor 228 from the metering valve 304. On the other hand, as depicted in FIG. 3B, when the sealing ball 316 is lifted away from the valve seat 318, the opening or the point of injection is opened by the sealing ball 316, thereby allowing the liquid precursor 228 to be injected or jetted out from the metering valve 304.

Other implementations of the liquid injection unit 204 (FIG. 2) are possible. According to an alternative implementation, the injection unit 204 (FIG. 2) can include a mass flow controller, comprising a controllable valve, where varying the position of the valve results in a varying liquid flow rate. According to yet another alternative implementation, the injection unit 204 can include a mass flow meter, which does not include a controllable valve, where varying the driving pressure exerted on it results in varying liquid flow rate.

Liquid Injection Method and Control System

FIG. 4 illustrates a method of delivering a liquid precursor into a thin film deposition chamber, according to embodiments. FIG. 5 illustrates a liquid precursor delivery stability control system for controlling the delivery of a vaporized liquid precursor into a thin film deposition chamber, according to embodiments. In the following, the method 400 (FIG. 4) of delivering the liquid precursor is described in conjunction with the control system 500 (FIG. 5).

Referring to FIG. 5, the liquid precursor delivery control system 500 for controlling the delivery of a vaporized liquid precursor into a thin film deposition chamber includes a liquid push pressure control system 510, an injection unit temperature control system 520, a carrier gas temperature control system 530 and a downstream pressure control system 540 that are communicatively coupled to each other, and are communicatively coupled to a central control unit 550. The liquid push pressure control system 510, which may be disposed upstream of the liquid injection unit 204 (FIG. 2) is configured to control the liquid precursor push pressure in the liquid delivery line 110*c* (FIG. 2) upstream of the liquid precursor injection unit 112 (FIG. 2), using a liquid pressure sensing means 514 and a liquid pressure control means 518 that are communicatively coupled to each other. The injection unit temperature control system 520, which may be disposed at or upstream of the liquid injection unit 204 (FIG. 2), is configured to control the liquid precursor temperature at or above the liquid injection unit 204 (FIG. 2), using a liquid temperature sensing means 524 and a liquid temperature control means 528 that are communicatively coupled to each other. The carrier gas temperature control system 530, which may be disposed at or upstream of the carrier gas valve 208 (FIG. 2), is configured to control the carrier gas temperature at or above the carrier gas valve 208 (FIG. 2), using a carrier gas temperature sensing means 534 and a carrier gas temperature control means 538 that are communicatively coupled to each other. The downstream pressure control system 540, which may be disposed downstream of the liquid injection unit 204 (FIG. 2), is configured to control the gas pressure downstream of the liquid injection unit 204 (FIG. 2), using a gas pressure sensing means 544 and a gas pressure control means 548 that are communicatively coupled to each other. Each of the liquid pressure sensing means 514 and the gas pressure sensing means 544 can include a suitable pressure sensor, e.g., a manometer, a transducer and the like. Each of the liquid temperature sensing means 524 and the carrier gas temperature sensing means 534 can include a suitable temperature sensor, e.g., thermocouple, thermistor, resistance temperature detector and the like. Each of the liquid pressure control means 518 and the gas pressure control means 548 can include a pressure regulator, a control valve and the like, which can be controlled by a suitable controller circuitry and/or algorithm. Each of the liquid temperature control means 528 and the carrier gas temperature control means 538 can include a heater and/or cooler, which can be controlled by an internal or external controller circuitry and/or algorithm.

Still referring to FIG. 5, each of the liquid push pressure control system 510, the injection unit temperature control system 520, the carrier gas temperature control system 530 and the downstream pressure control system 540, as well as the respective sensing means and the control means included therein are communicatively coupled to each other and to the central control or processing unit 550. The central control or processing unit 550 includes a processor, memory and storage devices that are collectively configured to store and execute executable algorithm for communicating with and at least partly automatically controlling the liquid push pressure control system 510, the injection unit temperature control system 520, the carrier gas temperature control system 530 and the downstream pressure control system 540, thereby implementing part or all of the method 400 automatically or algorithmically. For example, one or more of the liquid push pressure control system 510, the injection unit temperature control system 520, the carrier gas temperature control system 530 and the downstream pressure control system 540 may be activated upon detection of a mass flow rate variation that is out of range of a predefined manufacturing tolerance. The flow rate variation may be detected by, e.g., the mass flow meters 132 (FIG. 1B). Upon detection of the mass flow rate variation that is outside of the manufacturing tolerance, one or more of the liquid pressure control means 518, the liquid temperature control means 528, the carrier gas temperature control means 538 and the gas pressure control means 548, may at least partly automatically or algorithmically regulate the liquid push pressure in the liquid delivery line 110*c* (FIG. 2), the liquid precursor temperature at or above the liquid injection unit 204 (FIG. 2), the carrier gas temperature at or above the carrier gas valve 208 (FIG. 2) and the gas pressure downstream of the liquid injection unit 204 (FIG. 2), respectively, in conjunction with the central control unit 550.

Referring to FIGS. 4 and 5, the method 400 of delivering a liquid precursor into a thin film deposition chamber includes providing 410 a liquid precursor delivery unit 112 (FIG. 2) configured to deliver a vaporized liquid precursor 228 (FIG. 2) into the thin film deposition chamber 104 (FIG. 2). As described above, the liquid precursor delivery unit 112 comprises a liquid injection unit 204 (FIG. 2) configured to atomize the liquid precursor into atomized precursor droplets and a vaporization chamber 216 (FIG. 2) configured to vaporize the atomized precursor droplets prior to delivery into the thin film deposition chamber 104 (FIG. 2). The method additionally includes delivering the vaporized liquid precursor into the thin film deposition chamber 104 using the liquid precursor delivery unit 112, wherein delivering the vaporized liquid precursor comprises atomizing the liquid precursor 228 into atomized precursor droplets using the liquid injection unit 204 and vaporizing the atomized precursor droplets into the vaporized liquid precursor using the vaporization chamber 216. The liquid precursor delivery unit 112 and the liquid precursor 228 are such that, when the liquid precursor delivery unit 112 is operated under a lower stability condition, a mass flow rate of the liquid precursor varies by more than a manufacturing tolerance relative to an average mass flow rate of the liquid precursor 228 during a first time duration.

The lower stability condition that causes such variation includes one or more of a first liquid precursor temperature ($T_{PL1}$) at the liquid injection unit 204 (FIG. 2), a first liquid precursor pressure ($P_{PL1}$) upstream of the liquid injection unit 204 and a first gas pressure ($P_{PG1}$) downstream of the liquid injection unit 204. The inventors have discovered that such variation in the mass flow rate can lead to manufacturing nonuniformities, including variations in thickness, composition and film quality such as density across the substrate as well as across different substrates.

The inventors have discovered that operating 420 the liquid precursor delivery unit 112 under a higher stability condition causes the mass flow rate of the liquid precursor vary by less than the manufacturing tolerance relative to an average mass flow rate during a second time duration having the same time duration as the first time duration. In some embodiments, operating 420 the liquid precursor delivery unit 112 under the higher stability condition includes one or more of: setting or decreasing 424 the temperature of the liquid precursor 228 to a second liquid precursor temperature ($T_{PL2}$) at the liquid injection unit 204 (FIG. 2) that is lower than the first liquid precursor temperature ($T_{PL1}$); setting or increasing 426 the pressure of the liquid precursor 228 to a second liquid precursor pressure ($P_{PL2}$) upstream of the injection unit that is higher than the first liquid precursor pressure ($P_{PL1}$); and setting or increasing 428 the gas pressure downstream of the liquid injection unit 204 to a second gas pressure ($P_{PG2}$) downstream of the liquid injection unit 204 that is higher than the first downstream pressure ($P_{PG1}$).

Figure 4:
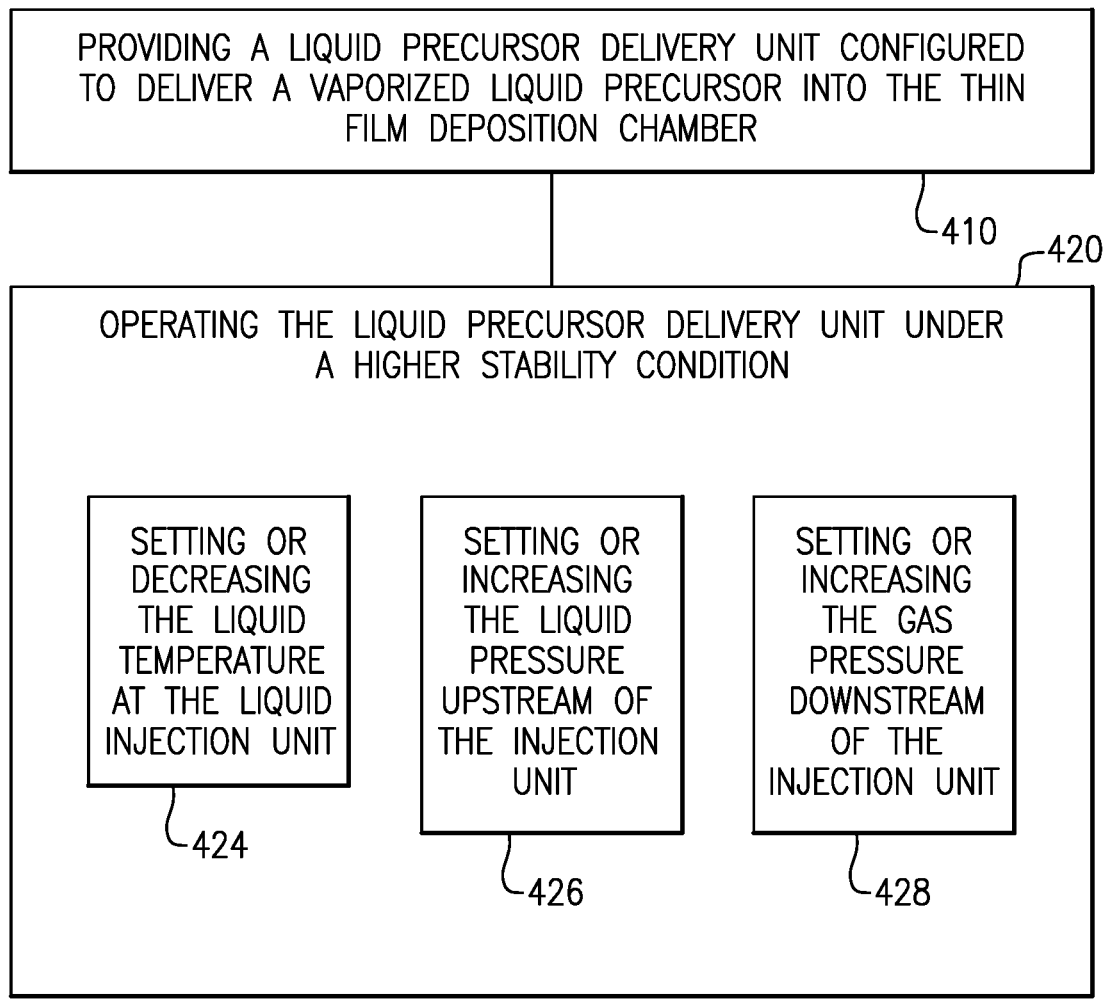
FIG. 4 illustrates a method of delivering a liquid precursor into a thin film deposition chamber, according to embodiments.

Still referring to FIG. 4, the inventors have discovered that operating 420 the liquid precursor delivery unit 112 (FIG. 2) under the higher stability condition according to various embodiments disclosed herein advantageously enables the delivery of the liquid precursor 228 into the thin film deposition chamber 104 (FIG. 2) with enhanced stability and repeatability. The enhanced stability and repeatability is enabled at least in part by, among other things, keeping the liquid precursor to remain in liquid phase and preventing vaporization of the liquid precursor upstream of the point of injection, as described above. Advantageously, the method 400 enables substantial suppression of the vaporization of the liquid precursor upstream of the point of injection, which in turn enables the suppression of formation of pockets of gas or bubbles being, thereby enabling enhanced stability of the vaporized precursor for depositing thin films in the thin film deposition chamber 104 (FIG. 2).

The enhanced stability and repeatability of the mass flow rate of the liquid precursor may be advantageously maintained despite the liquid precursor being heated to or close to a vaporization temperature at the point of injection, and/or the gas pressure downstream of the point of injection being at a pressure that is substantially lower that the vaporization pressure during deposition. As described herein, a vaporization temperature refers to a temperature at which the vapor pressure of the liquid precursor is sufficient for deposition, e.g., the temperature at which the vapor pressure is greater than about 0.1 Torr, 0.2 Torr, 0.5 Torr, 1 Torr, or a value in a range defined by any of these values. The temperature of the liquid precursor 228 may be defined by proximity to the vaporization temperature and/or the decomposition temperature. According to various embodiments, the liquid precursor 228 (FIG. 2) at the liquid precursor delivery unit 112 (FIG. 2) or the point of injection therein may be within +/−50° C., +/−30° C., +/−20° C., +/−10° C., or a value in a range defined by any of these values, of the vaporization temperature of the liquid precursor 228, or within 50° C., 30° C., 20° C., 10° C., or a value in a range defined by any of these values, below the decomposition temperature of the liquid precursor. The pressure downstream of the point of injection, e.g., in the mixing area 212 (FIG. 2), the vaporization chamber 216 (FIG. 2) and/or the thin film deposition chamber 104 (FIG. 2) may be 0.01-0.2 Torr, 0.2-0.4 Torr, 0.4-0.6 Torr, 0.6-0.8 Torr, 0.8-1.0 Torr, 1.0-1.5 Torr, 1.5-2.0 Torr, 2.0-2.5 Torr, 2.5-3.0 Torr, 3.0-4.0 Torr, 4.0-5.0 Torr, 5.0-6.0 Torr, 6.0-7.0 Torr, 7.0-8.0 Torr, 8.0-9.0 Torr, 9.0-10.0 Torr, 10.0-11.0 Torr, 11.0-12.0 Torr, or a pressure in range defined by any of these values.

Still referring to FIG. 4, the enhanced stability and repeatability may be quantified by the variability of the mass flow rate, which may be measured ty a mass flow meter 132 (FIG. 1B) relative to a manufacturing tolerance. Advantageously, operating 420 the liquid precursor delivery unit 112 within a higher stability condition enables the mass flow rate of the liquid precursor to be maintained within a manufacturing tolerance. The manufacturing tolerance of the mass flow rate of the liquid precursor can be dependent on the application. For example, for dielectric and conducting thin film for memory and logic semiconductor chip fabrication for advanced technology nodes (e.g., <130 nm), the manufacturing tolerance may dictate that the mass flow rate not vary by not more than 1%, 2%, 5%, 10%, 20% or a value in a range defined by any of these values, relative to an average mass flow rate of the liquid precursor during a time duration longer than 1 ms, 5 ms, 10 ms, 20 ms, 50 ms, 100 ms, 200 ms, 500 ms, 1 sec, 2 sec, 5 sec, 10 sec, 20 sec, 50 sec, 100 sec, 200 sec, 500 sec, 1000 sec, 2000 sec, 5000 sec, 10,000 sec, 100,000 sec, 1,000,000 sec, or a time duration in a range defined by any of these values. For instance, the time duration may correspond to an aggregated exposure time of hundreds or thousands of wafer processes between successive preventive maintenance operations of the thin film deposition system. For continuous precursor exposure such as in chemical vapor deposition (CVD), the time duration can represent an uninterrupted duration. For cyclical precursor exposure such as in atomic layer deposition (ALD), the time duration can be the duration of a single pulse, or an aggregate sum of a plurality of depositions. In some implementations, the time duration can exclude transient effects such an initial spike or dip when the liquid precursor delivery unit 112 (FIG. 2) is initially activated.

Still referring to FIG. 4, in some embodiments, operating 420 the liquid precursor delivery unit 112 (FIG. 2) under the higher stability condition includes setting or decreasing 424 the temperature ($T_{PL}$) of the liquid precursor 228 to a second liquid precursor temperature ($T_{PL2}$) at the liquid injection unit 204 that is lower than the first liquid precursor temperature ($T_{PL1}$) under the low stability condition. The $T_{PL2}$ can in part be achieved by decreasing 424 the temperature of the liquid precursor 228 (FIG. 2) to the $T_{PL2}$ at the liquid injection 112 (FIG. 2) using the injection unit temperature control system 520 (FIG. 5), or using the injection unit temperature control system 520 in conjunction with the carrier gas temperature control system 530 (FIG. 5).

Figure 5:
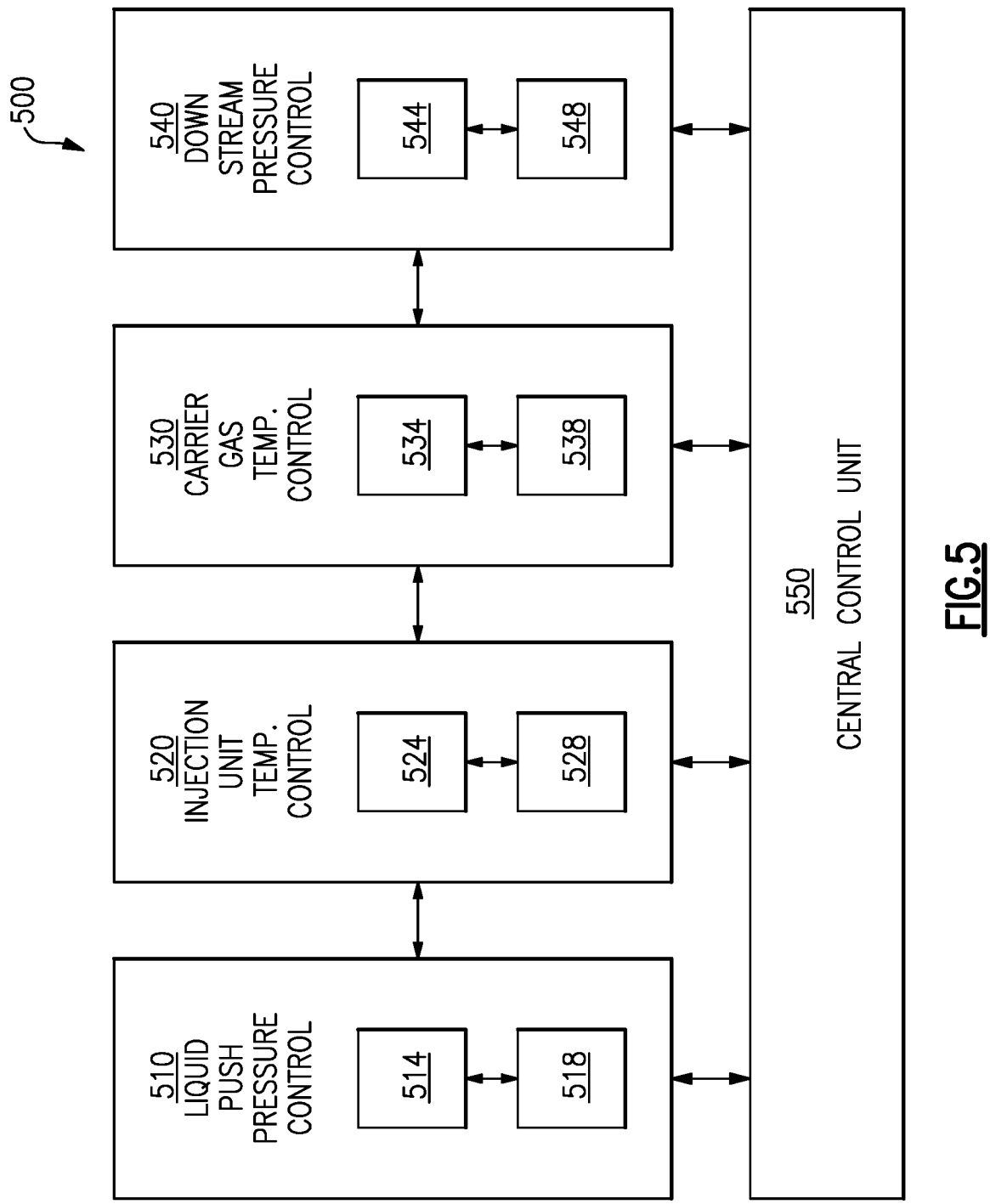
FIG. 5 illustrates a liquid precursor delivery stability control system for controlling the delivery of a vaporized liquid precursor into a thin film deposition chamber, according to embodiments.

Referring to FIG. 5, the injection unit temperature control system 520 is configured to actively control the temperature of the liquid precursor prior to being atomized into the mixing area 212 using the liquid temperature sensing means 524 and the liquid temperature control means 528. Upon detection of the mass flow rate variation that is outside of the manufacturing tolerance, e.g., using the mass flow meter 132 (FIG. 1B), the liquid temperature sensing means 534 and the liquid temperature control means 528 may at least partly automatically or algorithmically regulate the liquid precursor temperature at or above the point of injection within the liquid injection unit 204 (FIG. 2) in conjunction with the central control unit 550.

The liquid temperature control means 528 may include an active cooling means for lowering the ($T_{PL}$) temperature of the liquid precursor 228 at the injection unit 204 (FIG. 2) prior to being atomized into the mixing area 212 (FIG. 2). According to various embodiments, one or both of first and the second liquid precursor temperatures ($T_{PL1}$, $T_{PL2}$) of the liquid precursor upstream, e.g., immediately upstream, of the point of injection, may be set to or decreased to be within +/−50° C., +/−30° C., +/−20° C., +/−10° C., or a value in a range defined by any of these values, of the vaporization temperature of the liquid precursor 228 at atmospheric pressure, or within 50° C., 30° C., 20° C., 10° C., or a value in a range defined by any of these values, below the decomposition temperature at atmospheric pressure of the liquid precursor 228 (FIG. 2). By actively cooling, the temperature of the liquid precursor may advantageously be set or lowered from the $T_{PL1}$ to $T_{PL2}$ by at least 5° C.-50° C., 5° C.-10° C., 10° C.-20° C., 20° C.-30° C., 40° C.-50° C., or a value in a range defined by any of these values. It will be appreciated that the controlling the $T_{PL}$ within these range can be critical because, as discussed above, a $T_{PL}$ that is lower than these ranges can lead to inadequate vaporization of the liquid precursor, while a $T_{PL}$ that is higher than these ranges can lead to decomposition of the liquid precursor.

The inventors have discovered that, under some circumstances, cooling the temperature of the liquid precursor as described herein may have unintended negative consequences. For example, the lower liquid precursor temperature may cause lower atomization or precursor droplet formation efficiency and/or mixing efficiency in the mixing area 212, and/or lower vaporization efficiency in the vaporization chamber 216. To address these and other possible negative effects, in some embodiments, the lowered second liquid precursor temperature ($T_{PL2}$) of the liquid precursor 228 may at least partly compensated by heating carrier gas and mixing the atomized precursor droplets formed from the cooled liquid precursor with the heated carrier gas in the mixing are 212 (FIG. 2), as described below.

Referring to FIG. 5, the carrier gas temperature control system 530 is configured to actively control the temperature ($T_{CG}$) of the carrier gas prior to being introduced into the mixing area 212 using the carrier gas temperature sensing means 534 and the carrier gas temperature control means 538. Upon detection of the mass flow rate variation e.g., using the mass flow meter 132 (FIG. 1B), that is outside of the manufacturing tolerance, the carrier gas temperature sensing means 534 and the carrier gas temperature control means 538 may at least partly automatically or algorithmically regulate the carrier gas temperature to be heated to and/or maintained at a higher temperature at the carrier gas valve 208 above the mixing area 212 (FIG. 2) in conjunction with the central control unit 550.

In these embodiments, the carrier gas valve 208 may be configured to actively control the temperature of the carrier gas prior be being delivered into the mixing area 212. For example, the carrier gas temperature control system 530 may include an active heating means installed at the carrier gas valve 208. The carrier gas temperature control system 520 may include, e.g., the carrier gas temperature sensing means 534 configured to sense the temperature of the carrier gas upstream of the carrier gas valve 208 and, and a carrier gas temperature control means 538 including a heater to actively increase the temperature of the carrier gas prior to being introduced into the mixing area 212. The temperature of the carrier gas may be heated from a lower carrier temperature ($T_{CG1}$) under the lower stability condition by at least 5° C.-50° C., 5° C.-10° C., 10° C.-20° C., 20° C.-30° C., 40° C.-50° C., or a value in a range defined by any of these values, to a higher carrier temperature ($T_{CG2}$).

Advantageously, heating the carrier gas to the $T_{CG2}$ under the higher stability condition from the $T_{CG1}$ under the lower stability condition at least partly compensates the cooling effect of the liquid precursor as the liquid precursor is atomized into the mixing area 212 (FIG. 2). According to various implementations, the temperature of the atomized liquid precursor mixture formed by the mixing the atomized precursor droplets formed from the liquid precursor at the second liquid precursor temperature ($T_{PL2}$) with the heated carrier gas at the $T_{CG2}$ can be, substantially the same as the temperature of the atomized liquid precursor mixture formed by mixing the atomized precursor droplets formed from the liquid precursor at the first liquid precursor temperature ($T_{PL1}$) of the lower stability condition with the carrier gas at the $T_{CG1}$ prior to heating. For example, the temperature change of the atomized liquid precursor mixture in the mixing area 212 between the lower an higher stability conditions may be within 5° C.-50° C., 5° C.-10° C., 10° C.-20° C., 20° C.-30° C., 40° C.-50° C., or a value in a range defined by any of these values. It will be appreciated that the controlling the temperature of the atomized precursor mixture within these range can be critical because lower temperatures can lead to inadequate vaporization of the liquid precursor, higher temperatures can lead to decomposition of the liquid precursor.

Still referring to FIG. 4, in some embodiments, operating 420 the liquid precursor delivery unit 112 (FIG. 2) under the higher stability condition includes setting or increasing 426 the liquid pressure ($P_{PL}$) of the liquid precursor 228 to a second liquid pressure ($P_{PL2}$) of the higher stability condition upstream of the point of injection in the injection unit 112 that is higher than the first liquid pressure ($P_{PL1}$) of the lower stability condition upstream of the point of injection in the liquid injection unit 112. Setting or increasing 426 the liquid pressure of the liquid precursor 228 may be achieved using the liquid push pressure control system 510. In one implementation, the pressure of the push gas, e.g., hydrogen or an inert gas such as helium, argon or nitrogen that is supplied through the push gas line 110b (FIG. 2) to the liquid tank 110a (FIG. 2), can be increased to increase the displacing pressure of the liquid precursor 228 from the liquid tank 110a. The increased push pressure in the push gas line 110b can be regulated by the pressure regulator 224 (FIG. 2). Thus displaced liquid precursor 228 at the $P_{PL2}$ is delivered to the injection unit 204 through the liquid delivery line 110c.

Referring to FIG. 5, the liquid push pressure control system 510 is configured to actively control the $P_{PL}$ of the liquid precursor 228 (FIG. 2) prior to being atomized into the mixing area 212 (FIG. 2) using the liquid pressure sensing means 514 and the liquid pressure control means 518. Upon detection of the mass flow rate variation that is outside of the manufacturing tolerance, e.g., using the mass flow meter 132 (FIG. 1B), the liquid pressure sensing means 514 and the liquid pressure control means 518 may at least partly automatically or algorithmically regulate the liquid precursor pressure upstream of the liquid injection unit 204 (FIG. 2), e.g., at the liquid precursor source unit 110, in conjunction with the central control unit 550.

To controllably deliver the liquid precursor 228 to the injection unit 204 having the $P_{PL2}$, according to some embodiments, setting or increasing the $P_{PL}$ upstream of the liquid injection unit 112 comprises regulating a liquid push gas at the liquid precursor source unit 110 (FIG. 2). The pressure regulator 224 is configured such that the liquid push pressure in the liquid delivery line 110c can be controlled to be within 10-50 psia, 10-15 psia, 15-20 psia, 20-25 psia, 25-30 psia, 30-35 psia, 35-40 psia, 40-45 psia, 45-50 psia, or a pressure in a range defined by any of these vales, for instance between 14 psia and 30 psia, e.g., 28 psia.

Still referring to FIG. 4, in yet some other embodiments, operating 420 the liquid precursor delivery unit 112 under the higher stability condition includes setting or increasing 428 the gas pressure ($P_{PG}$) downstream of the injection unit 112 to a second gas pressure ($P_{PG2}$) that is higher than the first gas pressure ($P_{PG1}$). The $P_{PG2}$ can be achieved at least in part by limiting the conductance in an area between the liquid injection unit 112 and the thin film deposition chamber 104 using the downstream pressure control system 540. For example, increasing the $P_{PG}$ may be achieved by limiting the conductance to locally increase the $P_{PG}$ in one or both of the mixing area 212 and the vaporization chamber 216.

In some implementations, the local increase in the $P_{PG}$ may be achieved by elongating the volume of one or both of the mixing area 112 and the vaporization chamber 216 in a vertical direction perpendicular to the plane of the showerhead 113, such that a pressure gradient is created in the vertical direction. Elongating one or both of the mixing area 212 and the vaporization chamber 216 may include elongating the respective volumes to have an aspect ratio between a length in the vertical direction and a width or diameter thereof that is greater than 2:1, 4:1, 6:1, 8:1, 10:1 or a value in a range defined by any of these values. In some other implementations, one or both of the mixing area 212 the vaporization chamber 216 may include a continuously adjustable conductance-controlling means at lower portions thereof, such as a pressure regulator or a butterfly valve or the like, such that the local pressures therein are controlled to be higher than that of the gas pressure in the thin film deposition chamber 104 (FIG. 2).

Referring to FIG. 5, the downstream pressure control system 540 is configured to actively control the liquid precursor downstream of the liquid injection unit 112, e.g., in the mixing area 212 and/or the vaporization chamber 216, using the gas pressure sensing means 544 and the gas pressure control means 548. Upon detection of the mass flow rate variation that is outside of the manufacturing tolerance, e.g., using the mass flow meter 132 (FIG. 1B), the gas pressure sensing means 544 and the gas pressure control means 548 may at least partly automatically or algorithmically regulate the downstream of the liquid injection unit 112, e.g., in the mixing area 212 and/or the vaporization chamber 216, in conjunction with the central control unit 550.

According to various embodiments, during deposition, the total pressure in the thin film deposition chamber 104 may be 0.001.0-3.0 Torr, 3.0-5.0 Torr, 5.0-7.0 Torr, 7.0-10.0 Torr, or a pressure in range defined by any of these values. Without substantial reduction in conduction, the $P_{PG1}$ may be the same or different and be 0.001.0-3.0 Torr, 3.0-5.0 Torr, 5.0-7.0 Torr, 7.0-10.0 Torr, or a pressure in range defined by any of these values. Using the downstream pressure control system 540, the local pressures in one or both of the mixing area 212 and the vaporization chamber 216 may be set or increased to be higher relative to the thin film deposition chamber 104, e.g., by more than 10%, 20%, 50%, 100%, 200%, 500%, or a percentage in a range defined by any of these values, e.g., 0.002.0-3.0 Torr, 3.0-5.0 Torr, 5.0-7.0 Torr, 7.0-9.0 Torr. 9.0-12 Torr, or a value in a range defined by any of these values.

Applications

Figure 6A:
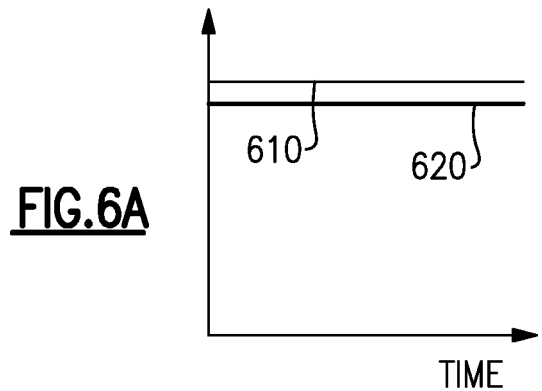
FIGS. 6A-6C illustrate thin film deposition processes in which the liquid precursor delivery methods and systems according to embodiments can be implemented.
Figure 6B:
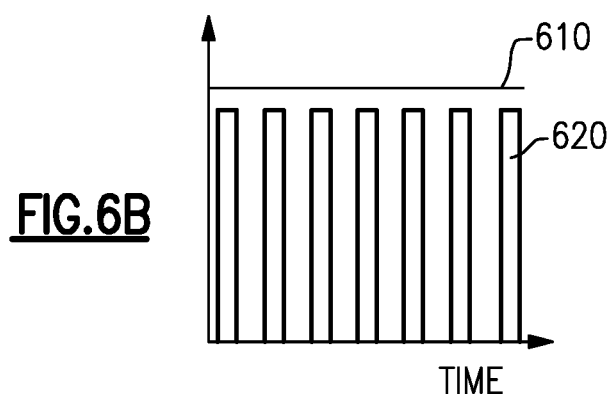
Figure 6C:
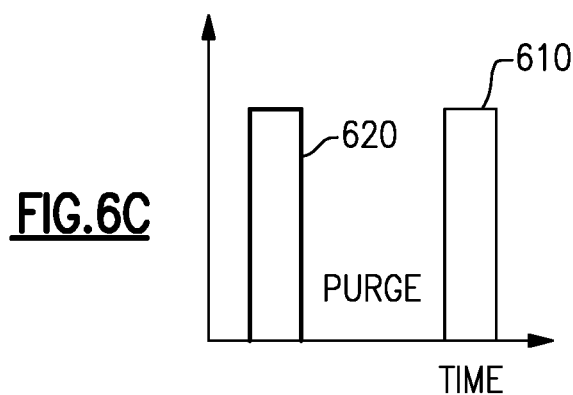

The methods and systems for delivering vaporized liquid precursor into a thin film deposition chamber can be implemented in various precursor-based deposition processes. FIGS. 6A-6C illustrate thin film deposition processes in which the liquid precursor delivery methods and systems according to embodiments can be implemented.

Representative examples of thin film processes in which the liquid precursor delivery according to embodiments can be implemented include chemical vapor deposition (FIG. 6A), atomic vapor deposition (FIG. 6B) and atomic layer deposition (FIG. 6C). Each of FIGS. 6A-6C is a schematic graph depicting a precursor parameter in the y-axis and time in the x-axis. The precursor parameter may include, e.g., a precursor flow rate, precursor partial pressure or a chamber pressure due to precursor introduction. Each of FIGS. 6A-6C depicts a first precursor 610 and a second precursors 620. One or both of the first and second precursors 610, 620 can be liquid precursor(s), or one but not the first and second precursors 610, 620 can be a liquid precursor. For example, the first precursor 610 can be an oxidizing precursor, e.g., $O_2$ or $NH_3$, from the gas panel 116 (FIG. 2) and the second precursor can be liquid precursor 228 (FIG. 2), e.g., a metal precursor. One or both of the first and second precursors 610, 620 can be introduced with a carrier gas. While only two precursors are shown for illustrative purposes, it will be understood that there can be more than two precursors.

FIG. 6A is a graph schematically illustrating precursor parameters as a function of time during deposition of a thin film using a continuous deposition process, e.g., chemical vapor deposition (CVD). The illustrated continuous deposition process comprises introducing the first precursor 610 and the second precursor 610 simultaneously or in a temporally overlapping manner into the thin film deposition chamber 104 (FIG. 2).

FIG. 6C is a graph schematically illustrating precursor parameters as a function of time during deposition of a thin film using a cyclical deposition, e.g., atomic layer deposition (ALD). The illustrated cyclic deposition process comprises cyclically introducing a pulse of the first precursor 610, followed by a pulse of the second precursor 620. The exposure times or pulse times of each of the first and second precursors 610, 620 can be in the range of about 0.1-1 sec., 1-10 sec., 10-30 sec., 30-60 sec., or a duration in a range defined by any of these values. The cycle 310 may be repeated multiple times to deposit a desired thickness of the thin film. The pulses of the first precursor 610 and the pulse of the second precursor 620 may be accompanied or separated by a purge gas. The purge gas may be continuous or pulsed. Examples of purge a gas which may be used include, but are not limited to, helium (He), argon (Ar), nitrogen ($N_2$), hydrogen ($H_2$), and mixtures thereof. In the illustrated example, the cycles of the first and second precursors 610, 620 do not overlap in time. However, examples are not so limited, and there may be a partial overlap between the cycles. In some implementations, the pulses of the purge may be introduced into the thin film deposition chamber 104 (FIG. 2) continuously or as pulses separating by the pulses of the first and second precursors 610 and 620. In still other embodiments, pulses of the first precursor 610 and the second precursor 620 may be separated by pump evacuation, without a purge gas.

FIG. 6B is a graph schematically illustrating precursor parameters as a function of time during deposition of a thin film using a hybrid deposition, e.g., atomic vapor deposition (AVD). The illustrated hybrid deposition process comprises cyclically introducing pulses of the second precursor 620 while introducing the first precursor 610 continuously or in pulses spanning at least one pulse of the second precursor 620. The exposure times or pulse times of the second precursor 620 and the first precursor 610 when pulsed can be in the range of about 0.1-1 sec., 1-10 sec., 10-30 sec., 30-60 sec., or a duration in a range defined by any of these values. In the illustrated embodiment, the first precursor 610 spans a plurality of the pulses of the second precursor. However, examples not so limited, and the first precursor may span, partially or completely, only one pulse of the second precursor 620. One or both of the first precursor 610 and the second precursor 620 may be accompanied by a carrier or purge gas. The purge or carrier gas may be continuous or pulsed, and may include, but are not limited to, helium (He), argon (Ar), nitrogen ($N_2$), hydrogen ($H_2$), and mixtures thereof.

The methods and systems for delivering a liquid precursor into a thin film deposition chamber can configured for a liquid precursor including B, N, Al, Si, P, Ti, V, Cr, Mn, Fe, Co, Ni, Zn, Ga, Ge, As, Se, Sr, Y, Zr, Nb, Mo, Ru, Ag, Cd, Sn, Sb, Ba, Hf, Ta, W, Re, Ti, La and Er, among others. Liquid precursors for a metal can be a metal halide or a metalorganic compound such as metal β-diketonates, metal cyclopentadienyls, metal alkoxides, metal alkyls, and metal alkylamides, depending on the organic complex associated to the metal. The liquid precursor can a precursor in liquid state or a solid precursor dissolved in a solvent. The liquid precursors can be used to form metal oxides, metal nitrides, compound semiconductors, chalcogenides, fluorides and elemental metals, among other compounds.

Figure 7:
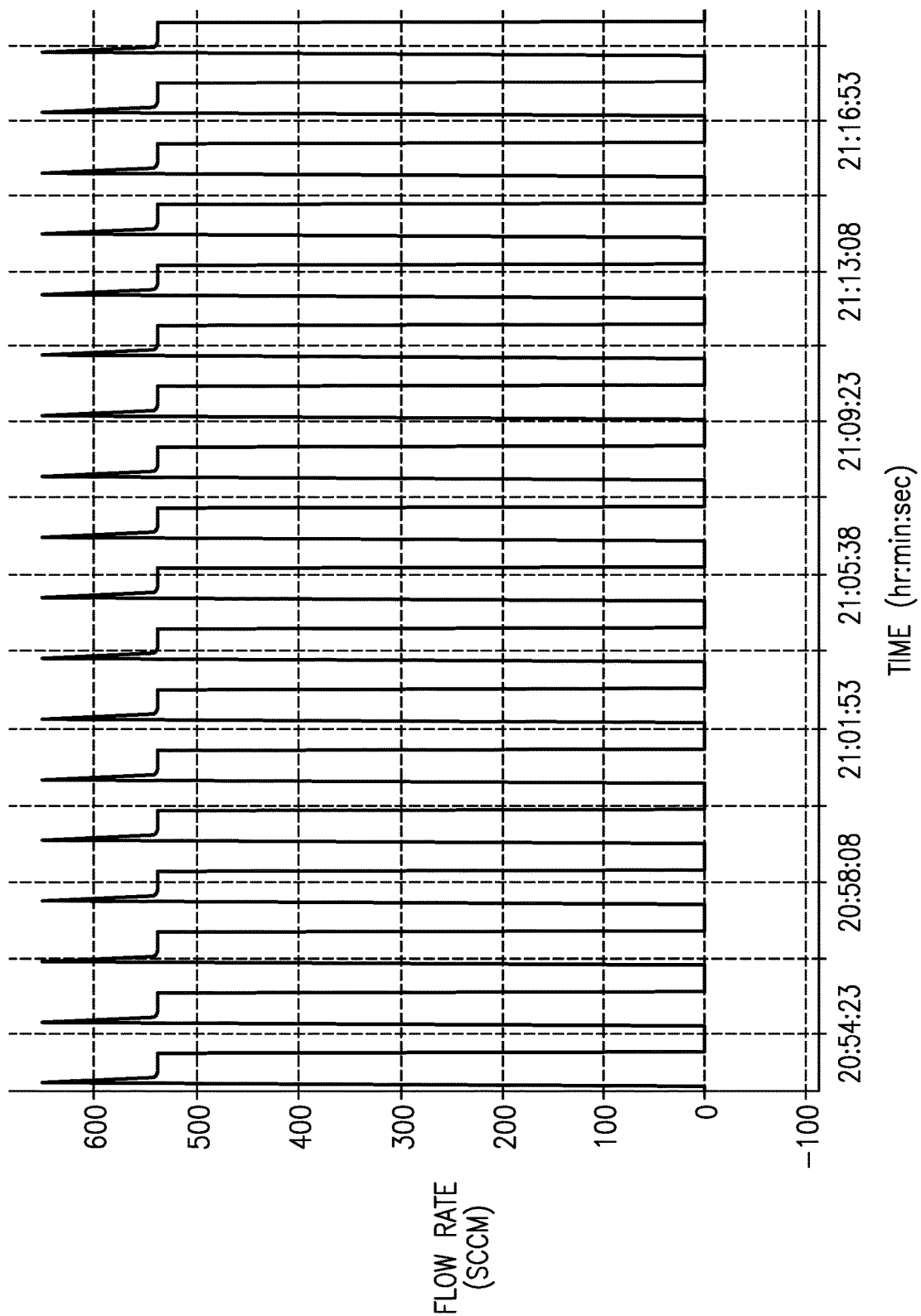
FIG. 7 illustrates an experimental graph of the mass flow rate as a function of time for a liquid precursor introduced into a thin film deposition chamber in pulse mode, using a liquid precursor delivery method according to embodiments.

FIG. 7 illustrates an experimental graph of measured mass flow rate as a function of time for a liquid precursor introduced in pulse mode using a delivery method according to embodiments. The y-axis is the flow rate in standard cubic centimeters per minute (secm) and the x-axis represents time (hr: min: sec). In the illustrated example, the pulses of the liquid precursor has a duration of about 60 seconds. For each pulse of the liquid precursor, after an initial transient spike, which corresponds to the moment of opening the point of injection of the liquid injection unit 112 (FIG. 2), the mass flow rate is highly constant within pulse and reproducible pulse-to-pulse. As discussed above, for cyclical precursor exposures such as the illustrated example, the time duration for defining a manufacturing tolerance can be the duration of a single pulse, or an aggregate sum of a plurality of depositions. In the illustrated example, the time duration can exclude the initial spike when the liquid precursor delivery unit 112 (FIG. 2) is initially activated.

Although the present invention has been described herein with reference to the specific embodiments, these embodiments do not serve to limit the invention and are set forth for illustrative purposes. It will be apparent to those skilled in the art that modifications and improvements can be made without departing from the spirit and scope of the invention.

Such simple modifications and improvements of the various embodiments disclosed herein are within the scope of the disclosed technology, and the specific scope of the disclosed technology will be additionally defined by the appended claims.

In the foregoing, it will be appreciated that any feature of any one of the embodiments can be combined or substituted with any other feature of any other one of the embodiments.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while features are presented in a given arrangement, alternative embodiments may perform similar functionalities with different components and/or sensor topologies, and some features may be deleted, moved, added, subdivided, combined, and/or modified. Each of these features may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A method of delivering a liquid precursor into a thin film deposition chamber, the method comprising:
provoding a liquid precursor delivery unit comprising a liquid injection unit, a mixing area and a vaporization chamber;
delivery unit delivering a vaporized liquid precursor into the thin film deposition chamber under a lower stability condition, the lower stability condition including a first liquid precursor temperature at the liquid injection unit, a first liquid precursor pressure upstream of the liquid precursor injection unit and a first gas pressure downstream of the liquid precursor injection unit, wherein the lower stability condition causes a first mass flow rate of the liquid precursor to vary by more than 10% relative to an average mass flow rate of the liquid precursor during a first time duration; and
delivering the vaporized liquid precursor into the thin film deposition chamber under a higher stability condition, the higher stability condition including a second liquid precursor temperature at the liquid injection unit that is lower than the first liquid precursor temperature, wherein the second liquid precursor temperature is caused at least in part by actively cooling the liquid precursor at the liquid injection unit by at least 5° C.,
wherein the higher stability condition causes a second mass flow rate of the liquid precursor to vary by less than the first mass flow rate and by less than 10% relative to an average mass flow rate during a second time duration having the same time duration as the first time duration,
wherein delivering the vaporized liquid precursor into the thin film deposition chamber under each of the lower stability condition and the higher stability condition includes atomizing the liquid precursor into atomized precursor droplets using the liquid injection unit, mixing the atomized precursor droplets and the carrier gas in the mixing area, and vaporizing the atomized precursor droplets into the vaporized liquid precursor in the vaporization chamber,
wherein delivering the vaporized liquid precursor into the thin film deposition chamber under the higher stability condition further comprises heating the carrier gas by at least 5° C., such that mixing comprises mixing cooled atomized precursor droplets and a heated carrier gas, and
wherein a temperature of a mixture of the atomized precursor droplets formed from the liquid precursor at the second liquid precursor temperature and the heated carrier gas is substantially the same as a temperature of a mixture of the atomized precursor droplets formed from the liquid precursor at the first liquid precursor temperature and the carrier gas prior to being heated.

2. The method of claim 1, wherein the higher stability condition further includes a second liquid pressure upstream of the injection unit that is higher than the first liquid pressure, and wherein the second liquid pressure is caused at least in part by setting a liquid push pressure upstream of the liquid injection unit.

3. The method of claim 2, wherein setting the liquid push pressure upstream of the injection unit comprises regulating a liquid push gas at a liquid precursor source unit that stores the liquid precursor.

4. The method of claim 3, wherein regulating the liquid push gas comprises regulating the liquid push pressure to exceed 14 psia, and wherein a liquid push pressure prior to regulating is below 14 psia.

5. The method of claim 1, wherein the higher stability condition further includes a second gas pressure downstream of the liquid injection unit that is higher than the first gas pressure, and wherein the second gas pressure is higher than a pressure in the thin film deposition chamber.

6. The method of claim 5, wherein the second gas pressure downstream of the liquid injection unit is caused at least in part by limiting a conductance between the liquid injection unit and the thin film deposition chamber.

7. The method of claim 6, wherein limiting the conductance comprises elongating one or both of the mixing area and the vaporizing chamber in a length direction relative to a width direction to have an aspect ratio exceeding 1:1.

8. The method of claim 6, wherein limiting the conductance comprises adjusting a valve or a regulator.

9. The method of claim 6, wherein the second gas pressure is greater than the first gas pressure by at least 10%.

10. The method of claim 1, wherein the liquid precursor has a difference between a vaporization temperature and a decomposition temperature under atmospheric pressure that is less than 100° C.

11. The method of claim 1, wherein the first and second time durations exceed 10 seconds.

12. The method of claim 1, wherein delivering the vaporized liquid precursor under each of the lower stability condition and the higher stability condition includes comprises delivering a pulse of the vaporized liquid precursor to deposit the thin film by a cyclic deposition process.

13. The method of claim 1, wherein delivering the liquid precursor under each of the lower stability condition and the higher stability condition includes comprises continuously delivering the liquid precursor to deposit the thin film by a continuous deposition process.

14. A method of delivering a liquid precursor into a thin film deposition chamber, the method comprising:
providing a liquid precursor delivery unit configured to deliver a vaporized liquid precursor into the thin film deposition chamber by atomizing the liquid precursor into atomized precursor droplets using a liquid injection unit and vaporizing the atomized precursor droplets into the vaporized liquid precursor in a vaporization chamber;
delivering a vaporized liquid precursor into the thin film deposition chamber under a lower stability condition, the lower stability condition including a first liquid precursor temperature at the liquid injection unit, a first liquid precursor pressure upstream of the liquid precursor injection unit and a first gas pressure downstream of the liquid precursor injection unit;
detecting a variation in a first mass flow rate of the liquid precursor that is greater than 10% relative to an average mass flow rate of the liquid precursor during a first time duration; and
delivering the vaporized liquid precursor into the thin film deposition chamber under a higher stability condition, the higher stability condition including
a second liquid precursor temperature at the liquid injection unit that is lower than the first liquid precursor temperature, wherein the second liquid precursor temperature is caused at least in part by actively cooling the liquid precursor at the liquid injection unit by at least 5° C.,
wherein the higher stability condition causes a second mass flow rate of the liquid precursor to vary by less than 10% relative to an average mass flow rate during a second time duration having the same time duration as the first time duration, wherein delivering the vaporized liquid precursor into the thin film deposition chamber under each of the lower stability condition and the higher stability condition includes mixing atomized precursor droplets and a heated carrier gas prior to vaporizing the atomized precursor droplets, and wherein a temperature of a mixture of the atomized precursor droplets formed from the liquid precursor at the second liquid precursor temperature and the heated carrier gas is substantially the same as a temperature of a mixture of the atomized precursor droplets formed from the liquid precursor at the first liquid precursor temperature and the carrier gas prior to being heated.

15. The method of claim 14, wherein the higher stability condition further includes a second liquid pressure upstream of the injection unit that is higher than the first liquid pressure, and wherein the second liquid pressure is caused at least in part by setting a liquid push pressure upstream of the liquid injection unit that stores the liquid precursor.

16. The method of claim 15, wherein the liquid push pressure is set to exceed 14 psia, and wherein a liquid push pressure under the lower stability condition is below 14 psia.

17. The method of claim 14, wherein the higher stability condition further includes the second gas pressure downstream of the liquid injection unit that is higher than the first gas pressure, and wherein the second gas pressure downstream pressure is higher than a pressure in the thin film deposition chamber.

18. The method of claim 17, wherein the second gas pressure downstream of the liquid injection unit is caused at least in part by limiting a conductance in between the liquid injection unit and the thin film deposition chamber, such that the second gas pressure is greater than the first gas pressure by at least 10%.

19. The method of claim 14, wherein delivering the vaporized liquid precursor under each of the lower stability condition and the higher stability condition includes comprises delivering a pulse of the liquid precursor to deposit the thin film by a cyclic deposition process.

20. The method of claim 14, wherein delivering the vaporized liquid precursor under each of the lower stability condition and the higher stability condition includes comprises continuously delivering the liquid precursor to deposit the thin film by a continuous deposition process.

* * * * *

UNITED STATES PATENT AND TRADEMARK OFFICE
CERTIFICATE OF CORRECTION

PATENT NO. : 11,459,654 B2
APPLICATION NO. : 16/952493
DATED : October 4, 2022
INVENTOR(S) : Finkelman et al.

It is certified that error appears in the above-identified patent and that said Letters Patent is hereby corrected as shown below:

On the Title Page

Column 2, item (57), (Abstract), Line 27, delete "Gas" and insert -- gas --.

Page 2, Column 1, item (57), (Abstract), Line 1, delete "that that" and insert -- that --.

In the Specification

Column 1, Line 56, delete "Gas" and insert -- gas --.

Column 1, Line 57, delete "that that" and insert -- that --.

Column 7, Line 44, delete "e.g." and insert -- e.g., --.

Column 9, Line 1, delete "50 m to 500 m." and insert -- 50 µm to 500 µm. --.

Column 14, Line 36, delete "an" and insert -- and --.

Column 16, Line 24-43, delete "Representative examples of thin film processes in which the liquid precursor delivery according to embodiments can be implemented include chemical vapor deposition (FIG. 6A), atomic vapor deposition (FIG. 6B) and atomic layer deposition (FIG. 6C). Each of FIGS. 6A-6C is a schematic graph depicting a precursor parameter in the y-axis and time in the x-axis. The precursor parameter may include, e.g., a precursor flow rate, precursor partial pressure or a chamber pressure due to precursor introduction. Each of FIGS. 6A-6C depicts a first precursor 610 and a second precursors 620. One or both of the first and second precursors 610, 620 can be liquid precursor(s), or one but not the first and second precursors 610, 620 can be a liquid precursor. For example, the first precursor 610 can be an oxidizing precursor, e.g., $O_2$ or $NH_3$, from the gas panel 116 (FIG. 2) and the second precursor can be liquid precursor 228 (FIG. 2), e.g., a metal precursor. One or both of the first and second precursors 610, 620 can be introduced with a carrier gas. While only two precursors are shown for illustrative purposes, it will be understood that there can be more Signed and Sealed this
Tenth Day of January, 2023

Katherine Kelly Vidal
*Director of the United States Patent and Trademark Office* than two precursors." and insert the same in Column 16, Line 23, as continuation of the same paragraph.

Column 17, Line 51, delete "(secm)" and insert -- (sccm) --.

In the Claims

Column 19, Line 7, Claim 1, before "delivering" delete "delivery unit".